United States Patent
Liao et al.

(10) Patent No.: US 7,182,650 B2
(45) Date of Patent: Feb. 27, 2007

(54) ELECTRICAL CONNECTORS WITH POSITIONING MECHANISM

(75) Inventors: Fang-Jwu Liao, Tu-Cheng (TW); Ming-Lun Szu, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/319,119

(22) Filed: Dec. 27, 2005

(65) Prior Publication Data

US 2006/0141841 A1   Jun. 29, 2006

(30) Foreign Application Priority Data

Dec. 24, 2004   (TW) .............................. 93220824 U

(51) Int. Cl.
*H01R 13/64* (2006.01)
(52) U.S. Cl. .................................................. 439/680
(58) Field of Classification Search ................ 439/680, 439/342, 70–71, 83
See application file for complete search history.

(56) References Cited

U.S. PATENT DOCUMENTS

| | | | | |
|---|---|---|---|---|
| 4,824,398 A | * | 4/1989 | Taylor | 439/557 |
| 5,067,911 A | * | 11/1991 | Saeki | 439/526 |
| 5,370,556 A | * | 12/1994 | Olsson | 439/681 |

* cited by examiner

*Primary Examiner*—Javaid H. Nasri
(74) *Attorney, Agent, or Firm*—Wei Te Chung

(57) ABSTRACT

Disclosed is an electrical connector (20) for connecting an IC package (30) having a mating surface (302) and a number of pins (300) and guiding walls (316) extending past the mating surface. The electrical connector includes a base (200) defining a number of passages (2040). A number of terminals (230) are set in the corresponding passages, respectively. A cover (210) defining a number of through-holes (214) in accordance with the passages and guiding slots (216) in compliance with the guiding walls is movably mounted on the base. A cam (220) is provided to drive the cover to move relative to the base. When the guiding walls of the IC package are inserted into the guiding slots, the pins of the IC package remain a distance away from the through-holes of the cover.

19 Claims, 9 Drawing Sheets

ELECTRICAL CONNECTORS WITH POSITIONING MECHANISM

BACKGROUND OF THE INVENTION

1. Field of the Invention

The present invention generally relates to the art of electrical connectors and, more particularly to an electrical connector having positioning mechanism.

2. Background of the Invention

Integrated circuit (IC) packages are generally classified as pin grid array (PGA) packages, ball grid array (BGA) packages and land grid array (LGA) packages depending on shape of the conductive elements.

Electrical connectors for removably connecting an IC package and a substrate, such as a printed circuit board (PCB), are correspondingly defined as PGA connectors, BGA connectors and LGA connectors.

An electrical connector typically includes an insulative housing defining a plurality of passages and a plurality of terminals residing in the corresponding passages, respectively. In use, conductive elements of the IC package, i.e. pins of the PGA package or soldering pads of the BGA package or conductive pads of the LGA package, are brought to contact with the corresponding terminals and, therefore, electrical connection between the IC package and the electrical connector is established.

To ensure performance of the electrical connector, the conductive elements of the IC package should be properly registered with the terminals. However, in use, the IC package may be difficult to be accurately positioned on the electrical connector and, therefore, the conductive elements of the IC package are likely to be displaced with respect to the corresponding terminals. As a consequence, it is possible that electrical connection between the IC package and the electrical connector may be adversely affected.

Therefore, there is a heretofore unaddressed need in the industry to address the aforementioned deficiencies and inadequacies.

SUMMARY OF THE INVENTION

According to a first preferred embodiment of the present invention, an electrical connector is used to electrically connect an IC package having a mating surface and a number of pins and guiding walls extending past the mating surface along a common insertion direction. The electrical connector includes a base defining a number of passages. A number of terminals are disposed in the corresponding passages, respectively. A cover defining a number of through-holes in accordance with the passages and guiding slots in compliance with the guiding walls is movably mounted on the base. A cam is provided to drive the cover to move with respect to the base between an open position and a closed position. When the guiding walls of the IC package are inserted into the guiding slots along the insertion direction, the pins of the IC package remain a distance away from the through-holes of the cover.

During the course of assembling the IC package on the electrical connector, the guiding walls begin to mate with the guiding slots prior to the mating of the pins of the IC package and the through-holes of the cover. Thus, the IC package may be accurately set on the electrical connector.

According to a second preferred embodiment of the present invention, an electrical connector is used for electrically connecting an IC package having a plurality of pins and positioning projections extending along a common insertion direction. The electrical connector includes an insulative housing having a supporting surface and a number of cavities extending from the supporting surface. A number of contacts are planted in the corresponding cavities, respectively. The insulative housing is provided with a number of positioning grooves in compliance with the positioning projections of the IC package. When the positioning projections mate with the positioning grooves along the insertion direction, the pins of the IC package are spaced apart from the supporting surface.

In course of mounting the IC package on the electrical connector, the positioning projections begin to mate with the positioning grooves prior to mating of the pins of the IC package and the cavities of the insulative housing. Consequently, the IC package may be accurately positioned on the electrical connector.

Other features and advantages of the present invention will become more apparent to those skilled in the art upon examination of the following drawings and detailed description of preferred embodiments, in which:

DETAILED DESCRIPTION OF THE PREFERRED EMBODIMENT

Reference will now be made to describe the preferred embodiments of the present invention in detail.

As shown in FIG. 1 to FIG.4 and FIG.8, an electrical connector 20 in accord with a first preferred embodiment of the present invention is used for electrically connecting an IC package 30 and a PGB (not shown).

Figure 1:
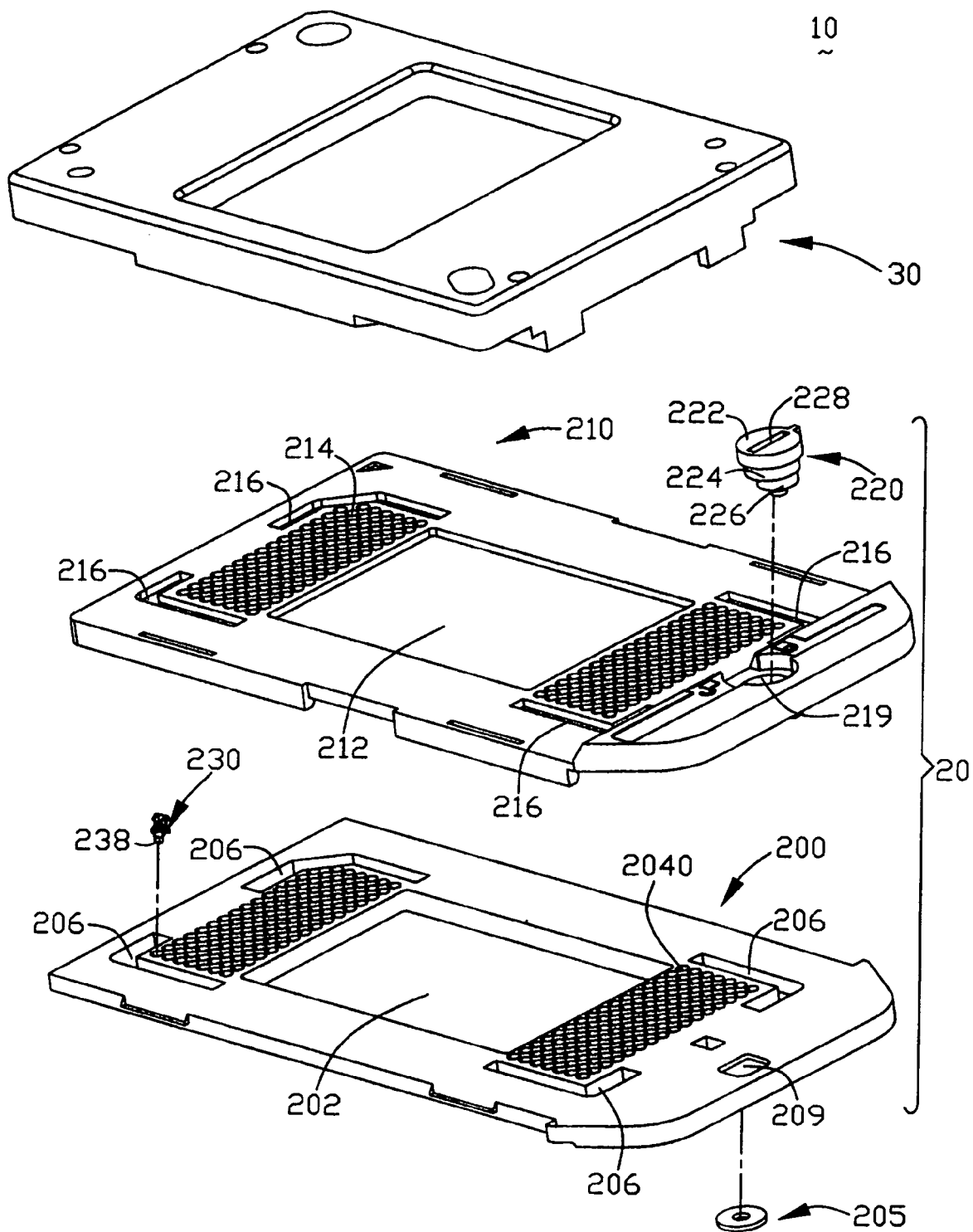
FIG. 1 depicts an exploded, isometric view of an electrical connector and an IC package in accord with a first preferred embodiment of the present invention.

Individual elements of the electrical connector 20 will now be described in greater detail. As shown in FIG. 1, the electrical connector 20 includes a base 200 having a plurality of terminals 230. A cover 210 is rested on the base 200. The cover 210 is movable with respect to the base 200 between an open position and a closed position. An actuating element, for example a cam 220, is provided at one side of the base 200 and the cover 210. The cam 230 is used to actuate the cover 210 to move along the base 200 between the open position and the closed position.

The cover 210 is molded from resin or the like and is shaped in the form of a rectangular planar board. A first rectangular opening 212 is defined in a center of the cover 210. A plurality of through-holes 214 extending throughout the cover 210 is defined at opposite sides of the first rectangular opening 212. Two pairs of first guiding slots 216 generally configured to an L-shaped configuration are provided at peripheral side of the through-holes 214. One of the first guiding slots 216 has a shape different from those of other's, for example a flattened corner, so as to assure the correct mate of the IC package 30 and the electrical connector 20. Alternatively, the first guiding slots 216 may take on other shapes, for example a columnar or post shape. A first chamber 219 is defined at one side of the cover 210.

In the present embodiment of the invention, the first guiding slots 216 are configured to extend throughout the cover 210. In an alternative form, the first guiding slots 216 may be designed to only partially extend along thickness of the cover 210. For example, referring to FIG. 8, the grooves 216 only extend into the cover 210 but do not extend into the base 200. In this case, there is no need to correspondingly define second guiding slots 206 in the base 200.

The base 200 is molded from resin or the like and is shaped in the form of a rectangular planar board. The base 200 defines a second rectangular opening 202 in a center thereof. The second rectangular opening 202 is sized and shaped in compliance with the first rectangular opening 212. A plurality of cavities 2040 extending throughout the base 200 is defined at opposite sides of the second rectangular opening 202 in a matrix pattern. The cavities 2040 are disposed in accord with the through-holes 214 of the cover 210. A second chamber 209 consistent with the first chamber 219 is defined at one side of the base 200.

Referring to FIGS. 1–4 and FIG. 9, in another embodiment of the present invention, two pairs of second guiding slots 206 in compliance with the first guiding slots 216 are defined in the base 200. The second guiding slots 206 may be configured to only partially extend along thickness of the base 200 or extend throughout the base 200. The second guiding slots 206 are slightly wider than the first guiding slots 216 so that the movement of the cover 210 between the open position and the closed position is allowed.

A plurality of terminals 230 is planted in the corresponding cavities 2040, respectively. Each of the terminals 230 includes a contacting section (not numbered) to contact with a pin 300 of the IC package 30 and an opposite soldering section (not numbered) to be connected to the PCB via a soldering ball 308 attached thereon.

The cam 220 includes a head 222, a connecting section 224 extend downward from the head 222 and a mounting section 226 for fastening the cam 220. The head 222 generally takes on a columnar configuration. A slot 228 is defined in the head 222 so that driving tools can be inserted therein to actuate the cam 220. A base ring 205 is provided to fasten the cam 220 to the base 200 and the cover 210. In another embodiment of the present invention, other actuating element, such as a driving lever, may also be applied to actuate the cover 210 to move with respect to the base 200.

Figure 2:
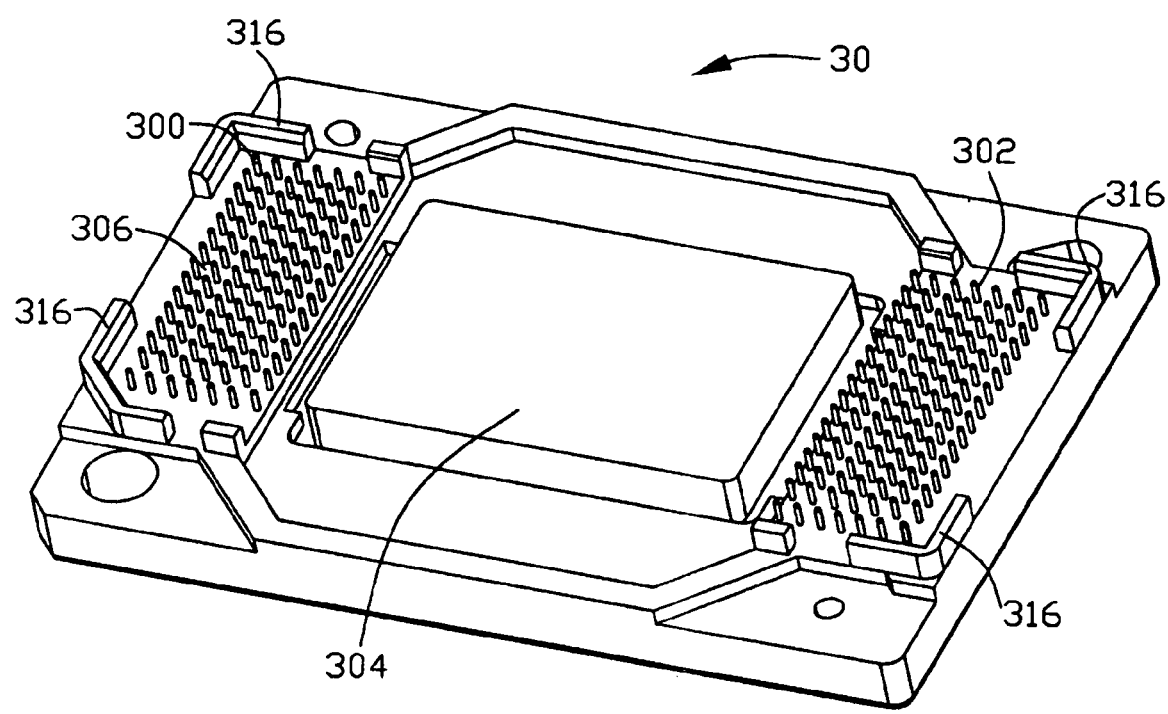
FIG. 2 depicts a bottom view of the IC package shown in FIG. 1.

As best shown in FIG. 2, the IC package 30 has a mating surface 302 to mate with the cover 210. A radiator section 304 is formed at a center of the IC package 30. The radiator section 304 protrudes upward beyond the mating surface 302. A plurality of pins 300 extends upward from the mating surface 302 to define a pin area 306. The pins 300 are disposed consistent with the through-holes 214 of the cover 210 and the cavities 2040 of the base 200. A plurality of guiding walls 316 is formed at peripheral side of the pin area 306. The guiding walls 316 are defined in accord with the first guiding slot 216 of the cover 210 and the second guiding slot 206 of the base 200. The guiding walls 316 extend upward further with respect to tips of the pins 300.

Assembly of the electrical connector 20 will now be described in greater detail. As shown in FIG. 1, the terminals 230 are positioned in the corresponding cavities 2040, respectively. The cover 210 is mounted on the base 200. The first rectangular opening 212 is situated in compliance with the second rectangular opening 202. The through-holes 214 are registered with the cavities 2040. The first chamber 219 is located corresponding to the second chamber 209. The cam 220 is inserted into the first chamber 219 and the second chamber 209 in sequence and tightened to the cover 210 and the base 200 via the base ring 205.

Figure 3:
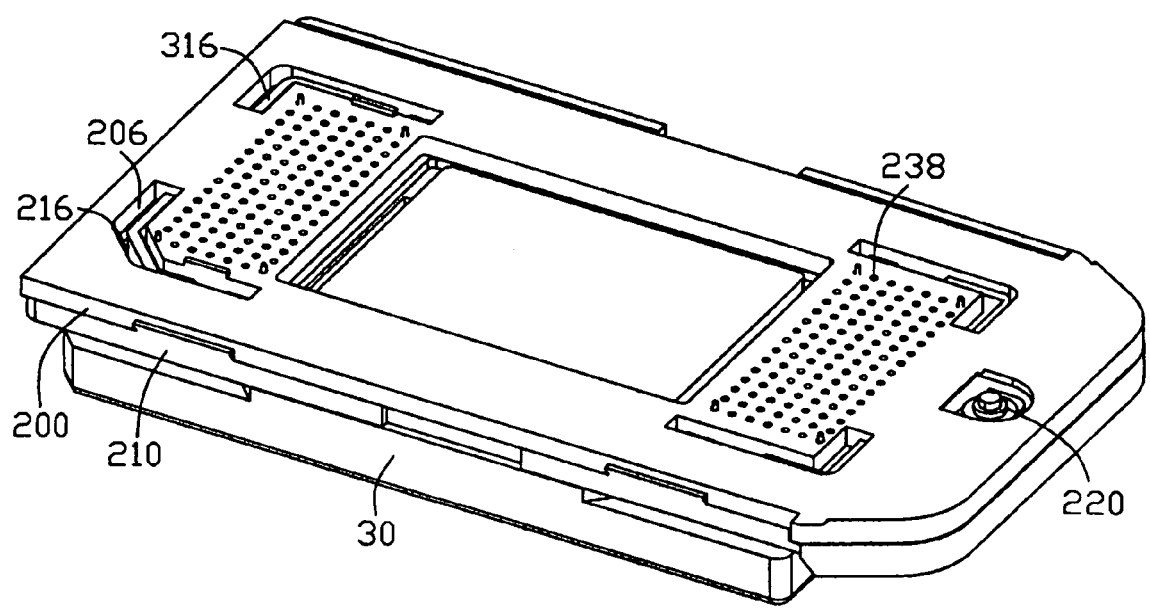
FIG. 3 depicts a bottom view of assembly of the electrical connector and the IC package shown in FIG. 1, wherein a cover of the electrical connector is oriented to an open position.
Figure 4:
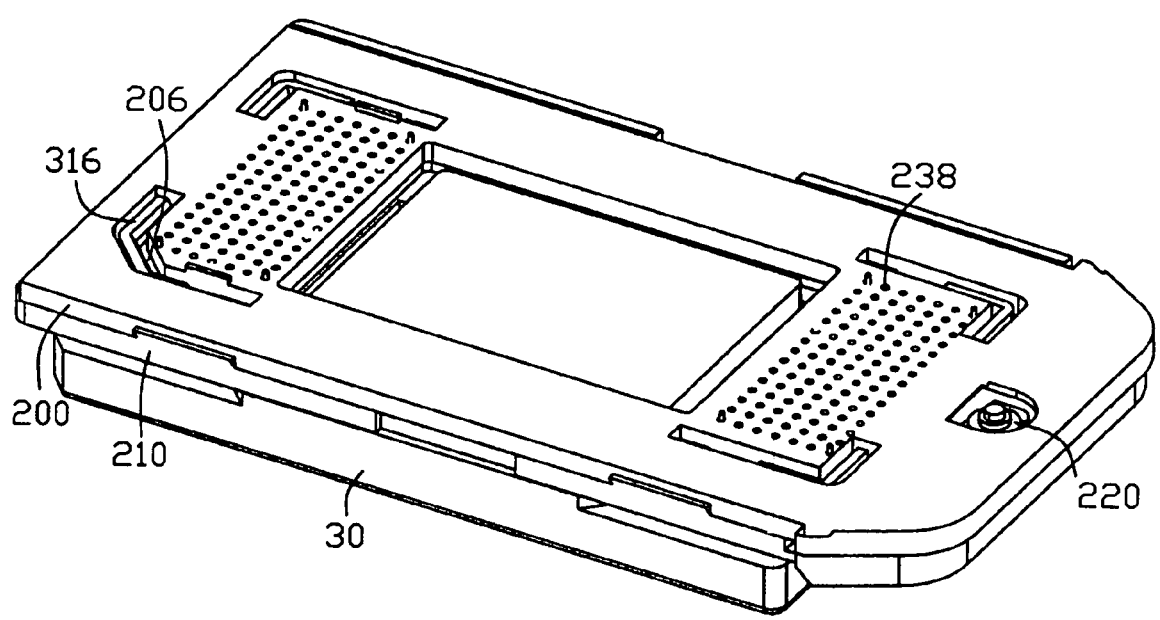
FIG. 4 is similar to FIG. 3, but shown the cover of the electrical connector been oriented to a closed position.

Operation of the electrical connector 20 will now be described in greater detail. As best shown in FIG. 3 and FIG. 4, in use, the cover 210 is oriented to the open position. The guiding walls 316 of the IC package 30 are plugged into the corresponding first guiding slots 216 of the cover 210. The IC package 30 is further pressed and the pins 300 thereof are inserted into the corresponding through-holes 214 of the cover 210, respectively. When the pins 300 are in a fully inserted position, the guiding walls 316 is situated within the guiding slots 206, 216.

The cam 220 is actuated to actuate the cover 210, together with the IC package 30 assembled thereon, to move with respect to the base 200 to the closed position. In the closed position, the pins 300 of the IC package 30 are brought to contact with the terminals 230 residing in the cavities 2040. Thus, electrical connection between the IC package 30 and the electrical connector 20 is obtained.

During the course of mounting the IC package 30, the guiding walls 316 begin to mate with the first guiding slots 216 prior to mating of the pins 300 of the IC package and the through-holes 214 of the cover 210. Therefore, pins 300 may be accurately inserted into the through-holes 214.

Additionally, in use, when the IC package 30 is securely mounted on the electrical connector 20, the engagement of the guiding walls 316 and the guiding slots 206, 216 may prevent the IC package 30 from being displaced with respect to the electrical connector 20 under extreme shock or vibration at a sudden.

Figure 5:
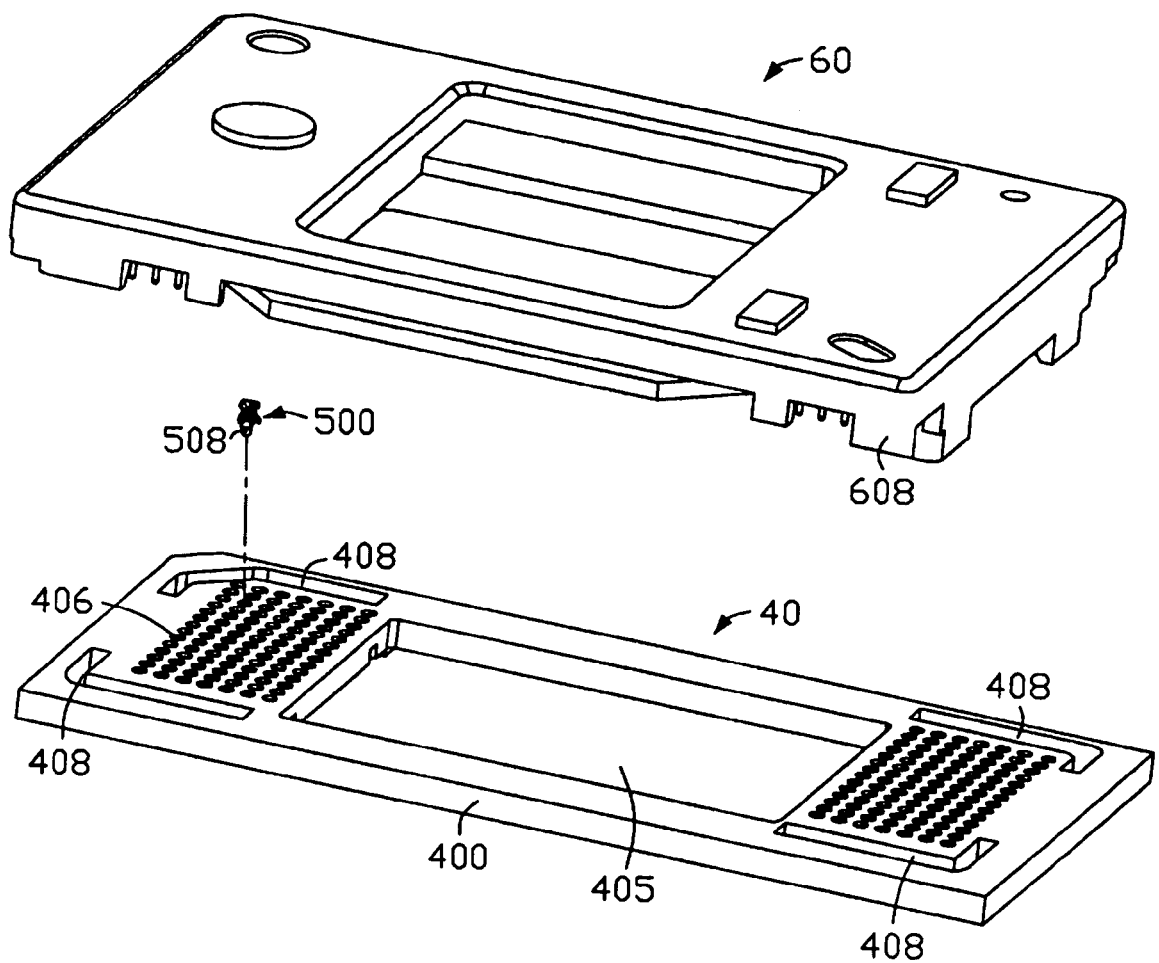
FIG. 5 depicts an exploded, isometric view of an electrical connector and an IC package according to a second preferred embodiment of the present invention.
Figure 6:
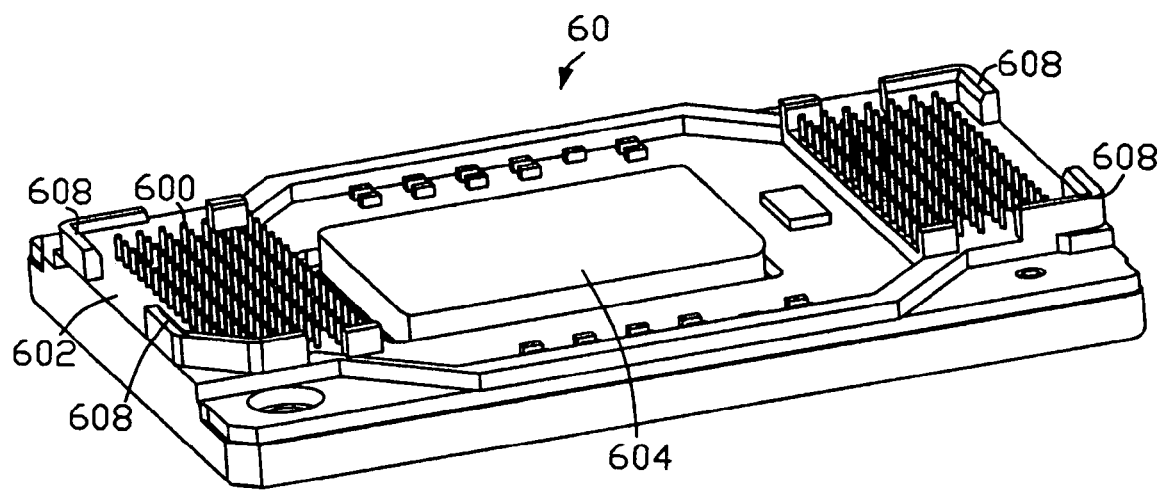
FIG. 6 depicts a bottom view of the IC package shown in FIG. 5.
Figure 7:
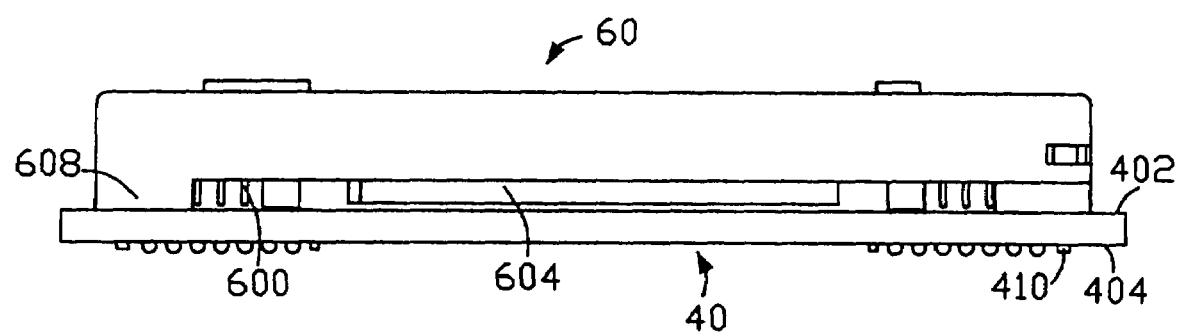
FIG. 7 depicts a side view of the electrical connector shown in FIG. 5, wherein positioning projections of the IC package begin to mate with positioning grooves defined in the electrical connector.
Figure 8:
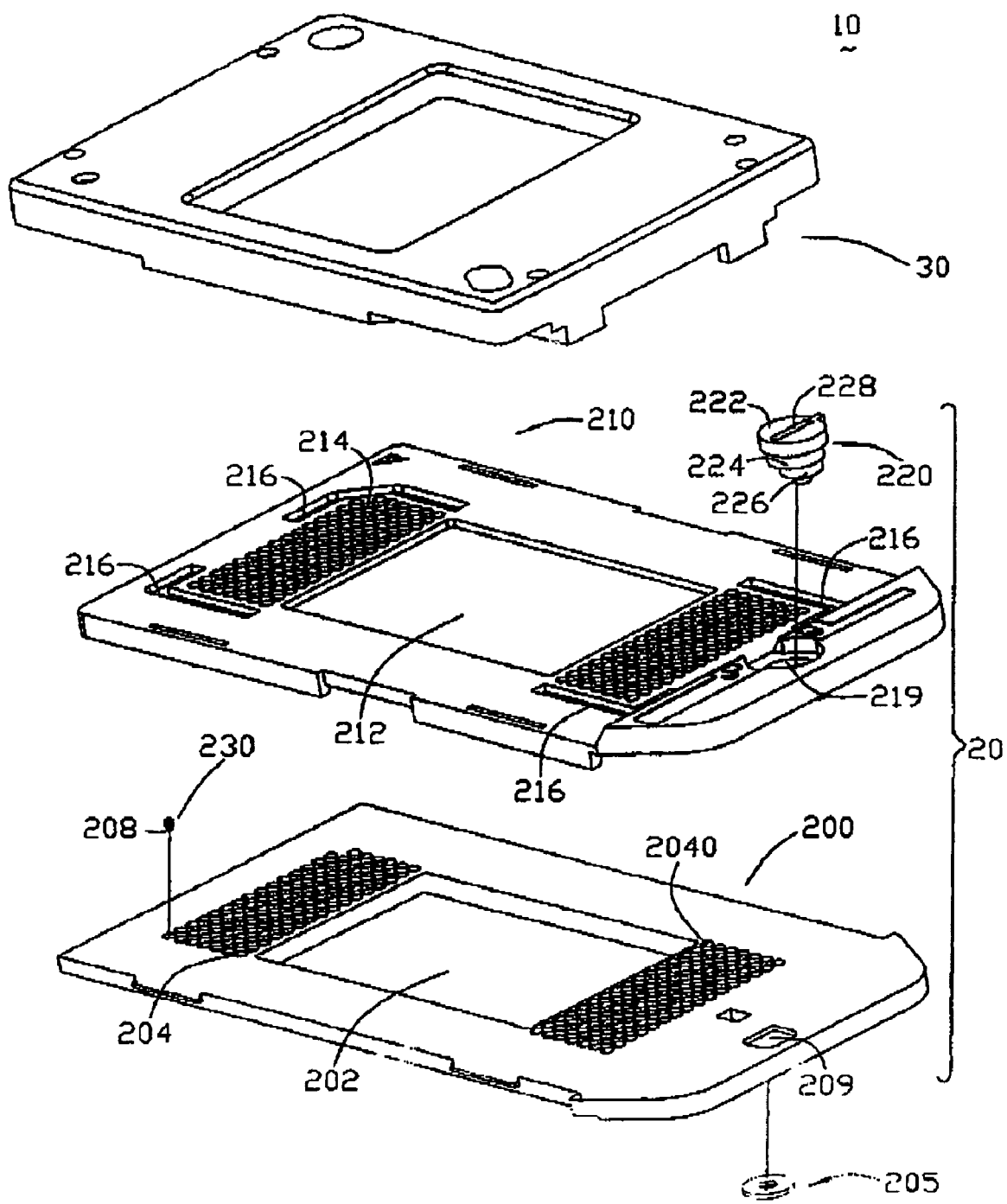
FIG.8 depicts an exploded, isometric view of another alternative form of the electrical connector and an IC package in the first preferred embodiment of the present invention, wherein the grooves only extend through the cover but do not extend into the base.
Figure 9:
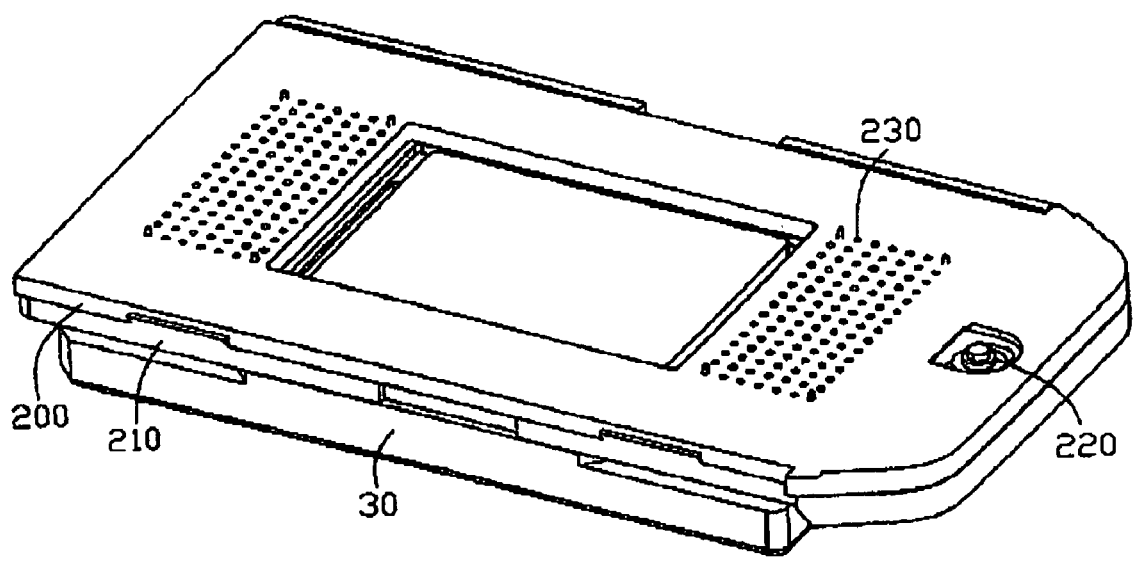
FIG.9 depicts an assembled view of an alternative form of the electrical connector assembly shown in FIG. 1, wherein second guiding slots are configured to only partially extend along thickness of the base.

As shown in FIG. 5 through FIG. 7, an electrical connector 40 in accord with a second preferred embodiment of the present invention is used to electrically connect an IC package 60 and a PCB (not shown).

Individual elements of the electrical connector 40 will now be described in greater detail. As shown in FIG. 5, the electrical connector 40 includes an insulative housing 400 defining a plurality of passageways 406 and a plurality of contacts 500 received in the corresponding passageways 406, respectively.

The insulative housing 400 is molded from resin or the like and is shaped in the form of a rectangular planar board. The insulative housing 400 includes a supporting surface 402 to support the IC package 60, a mounting surface 404 mountable on the PCB, and a plurality of passageways 406 extending between the supporting surface 402 and the mounting surface 404 in a matrix pattern. The insulative housing 400 is formed with a plurality of standoffs 410 projecting from the mounting surface 404. A rectangular opening 405 is defined in a center of the insulative housing 400.

Two pairs of positioning grooves 408 are defined at peripheral side of the passageways 406. The positioning grooves 408 are configured to an L-shaped configuration. One of the positioning grooves 408 has a shape different from those of other's, for example a flattened corner, so as to assure proper mating of the IC package 60 and the electrical connector 40. Alternatively, the positioning grooves 408 may take on other shape, for example a columnar or post shape. In the present embodiment, the positioning grooves 408 are configured to extend throughout the insulative housing 400. In an alternative form, the positioning grooves 408 may also be designed to only partially extend along thickness of the insulative housing 400.

A plurality of contacts 500 is positioned within the corresponding passageways 406, respectively. Each of the contacts 500 includes a contacting section (not numbered) to contact with a pin 600 of the IC package 60 and an opposite soldering section (not numbered) to be connected to the PCB via a soldering ball 508 attached thereon.

As best shown in FIG. 6, the IC package 60 has a mating surface 602 to mate with the electrical connector 40. A plurality of pins 600 extends upward from the mating surface 602. The pins 600 are disposed consistent with the passageways 406 of the insulative housing 400. A plurality of positioning walls 608 is formed at peripheral side of the pins 600. The positioning walls 608 are defined in accord with the positioning grooves 408 of the insulative housing 400. A radiator section 604 is formed at a center of the IC package 60. The radiator section 604 protrudes upward beyond the mating surface 602.

Assembly and operation of the electrical connector 40 will now be described in greater detail. As shown in FIG. 5 and FIG. 7, the contacts 500 are inserted into the corresponding passageways 406 from one side of the mating surface 402 and the mounting surface 404, respectively. In use, the positioning walls 608 of the IC package 60 are plugged into the corresponding positioning grooves 408 of the insulative housing 400, respectively. The pins 600 of the IC package 60 are further inserted into the corresponding passageways 406 and brought to contact with the contacts 500, respectively. When the pins 600 are in a fully inserted position, the positioning walls 608 are situated within the positioning grooves 408.

During the course of mounting the IC package 60, the positioning walls 608 begin to mate with the positioning grooves 408 prior to the mating of the pins 600 of the IC package 60 and the passages 406 of the insulative housing 400. Therefore, pins 600 may be accurately inserted into the passageways 406.

Additionally, in use, when the IC package 60 is securely mounted on the electrical connector 40, the cooperation of the positioning walls 608 and the positioning grooves 408 may prevent the IC package 60 from being displaced with respect to the electrical connector 40 under extreme shock or vibration.

It should be understood that the positioning of the IC package 60 on the electrical connector 40 may be realized in other manners. For example, in an alternative form, the positioning walls may be integrally formed with the insulative housing 400, and the positioning grooves may be correspondingly defined in the IC package 60. The IC package 60 may also be accurately positioned on the electrical connector 40 as long as the positioning walls begin to mate with the positioning grooves prior to the mating of the pins 600 and the passageways 406.

While the present invention has been described with reference to specific embodiments, the description of the invention is illustrative and is not to be construed as limiting the invention. Various of modifications to the present invention can be made to the preferred embodiments by those skilled in the art without departing from the true spirit and scope of the invention as defined by the appended claims.

What is claimed is:

1. An electrical connector for electrically connecting an IC package having a plurality of pins and positioning projections extending therefrom along a common insertion direction, the electrical connector comprising:
    an insulative housing having a supporting surface for supporting the IC package, a mounting surface opposite to the supporting surface, and a plurality of passageways extending between the supporting surface and the mounting surface;
    a plurality of contacts, each insertable into one of the passageways from one of the supporting surface and the mounting surface;
    wherein the insulative housing is provided with a plurality of positioning grooves in compliance with the positioning projections of the IC package, and when the positioning projections mate with the positioning grooves along the insertion direction, the pins of the IC package are spaced apart from the supporting surface.

2. The electrical connector of claim 1, wherein the positioning grooves extend throughout the insulative housing.

3. The electrical connector of claim 1, wherein the positioning grooves partially extend along thickness of the insulative housing.

4. The electrical connector of claim 1, wherein at least one of the positioning grooves is differently configured than other positioning grooves.

5. The electrical connector of claim 4, wherein the positioning grooves have an L-shaped configuration and one of the L-shaped positioning grooves has a flattened corner.

6. The electrical connector of claim 1, wherein the mounting surface of the insulative housing is formed with a plurality of standoffs.

7. The electrical connector of claim 1, wherein the positioning grooves are set at peripheral side of the passageways.

8. An electrical connector for electrically connecting an IC package having a mating surface and a plurality of conductive elements and a plurality of projections extending away from the mating surface in a common mating direction, the electrical connector comprising:
    an insulative housing having a supporting surface facing the mating surface of the IC package and a plurality of passageways extending from the supporting surface;
    a plurality of terminals residing within the corresponding passageways, respectively, each terminal comprising a contact section to engage with the conductive element of the IC package;
    wherein the insulative housing is provided with a plurality of guiding slots in compliance with the projections, and the projections mate with the guiding slots at an initial position where the conductive elements of the IC package are spaced apart from the contact sections of the terminals.

9. The electrical connector of claim 8, wherein at least one of the guiding slots is differently configured than other guiding slots.

10. The electrical connector of claim 8, wherein the guiding slots extend throughout the insulative housing.

11. The electrical connector of claim 8, wherein the guiding slots extend partially along thickness of the insulative housing.

12. An electrical assembly comprising:
- an IC package module defining a plurality of downward conductive elements;
- an electrical connector located below the IC package module and including a plurality of contacts having upper contacting portions upwardly communicating with the corresponding conductive elements, respectively; and
- complementary interengaging devices formed on both said IC package module and said connector; wherein
- when the IC package module is assembled to the connector in a vertical direction, the complementary interengaging devices are initially coupled to each other, before the conductive elements of the IC package module and the contacting portions of the contacts are coupled to each other, for assuring precise alignment between the IC package module and the connector in said vertical direction and thus corresponding correct vertical coupling between the conductive elements and the corresponding contacting portions of the contacts, respectively, during the successive assembling in said vertical direction.

13. The assembly as claimed in claim 12, wherein said complementary interengaging devices include at least an alignment groove and at least an alignment block which are aligned with each other in the vertical direction.

14. The assembly as claimed in claim 13, wherein said alignment groove is formed in the connector and the alignment block is formed on the IC package module.

15. The assembly as claimed in claim 12, wherein the complementary interengaging devices are arranged to allow the IC package module to move horizontally relative to the connector.

16. The assembly as claimed in claim 15, wherein the connector includes a base and a cover, said cover together with the IC package module being moveable with regard to the base.

17. The assembly as claimed in claim 16, wherein said interengaging devices are applied to both said cover and said base.

18. The assembly as claimed in claim 12, wherein the interengaging devices are similar to each other.

19. The assembly as claimed in claim 18, wherein the interengaging devices are essentially snugly coupled to each other with limited clearance.

* * * * *